United States Patent
Wolaver (12)

(10) Patent No.: US 6,608,875 B1
(45) Date of Patent: Aug. 19, 2003

(54) FREE-RUNNING-FREQUENCY ADJUSTMENT CIRCUIT FOR A CLOCK RECOVERY SYSTEM

(75) Inventor: Dan H. Wolaver, Westbrookfield, MA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/562,783

(22) Filed: May 2, 2000

(51) Int. Cl.[7] ................................. H03D 3/24
(52) U.S. Cl. ................. 375/375; 375/373; 331/25
(58) Field of Search .................. 375/375, 376, 375/373, 371; 327/154, 156, 159, 291; 713/400, 500, 502, 503, 600, 601; 331/18, 25, 1 R

(56) References Cited

U.S. PATENT DOCUMENTS 4,464,771 A * 8/1984 Sorensen ................. 375/374
5,276,712 A * 1/1994 Pearson ................... 375/360
5,307,028 A * 4/1994 Chen ...................... 331/1 A
5,315,270 A * 5/1994 Leonowich ............... 331/1 A
5,987,085 A * 11/1999 Anderson ................. 375/374
6,072,370 A * 6/2000 Nakamura ................ 331/25

* cited by examiner

Primary Examiner—Phuong Phu
(74) Attorney, Agent, or Firm—William K. Bucher; David N. Caracappa

(57) ABSTRACT

A clock recovery system includes a source of a data signal having transitions, an injection-locked oscillator having a free-running frequency and generating a clock signal, and a free-running frequency adjustment circuit. The free running frequency adjustment circuit includes a transition density detector for detecting the density of the transitions in the data signal; a phase error detector for detecting the phase error between the clock signal and the data signal; and a correlator for adjusting the free-running frequency of the injection locked oscillator in response to the correlation between the detected transition density in the data signal and the phase error between the data signal and the local oscillator.

21 Claims, 4 Drawing Sheets

FREE-RUNNING-FREQUENCY ADJUSTMENT CIRCUIT FOR A CLOCK RECOVERY SYSTEM

FIELD OF THE INVENTION

The present invention relates to a clock recovery system, and in particular to a high frequency, wide bandwidth, clock recovery system.

BACKGROUND OF THE INVENTION

Clock recovery is the process of synchronizing a local clock signal to a received data signal. That is, clock recovery time-aligns transitions in the received data signal to transitions of the local clock signal. When the local clock signal is synchronized to the received data signal, that clock signal may be used to synchronize the remainder of the signal processing circuitry in the receiver. Local oscillators in receivers are usually set during fabrication to a free-running frequency equal to the nominal frequency of the data signal. However, the frequency of the oscillator signal may not be set exactly to that nominal frequency, and/or the received data signal may not be at the nominal frequency, and/or the oscillator frequency may drift due to component aging in the oscillator or temperature variation during operation. When there are not data edges for a time, the oscillator is essentially free-running, and the phase of the free-running local oscillator will drift away from the phase of the received data signal.

Clock recovery from a data signal is sometimes performed using a second order phase-locked loop. Such a phase-locked loop includes an integrator to eliminate the free running frequency error, described above. However, a phase-locked loop is relatively complex and has a relatively narrow bandwidth. In some cases, such as in test equipment, it is necessary that the clock recovery system have a relatively wide bandwidth. In such cases, injection-locked oscillators have been used. Injection-locked oscillators have a wide bandwidth, and are well suited for clock recovery systems used in such applications. An injection-locked oscillator, by itself, does not, however, correct the free-running frequency error in the local oscillator.

One solution to correcting the free-running frequency error in injection-locked oscillators is to periodically measure the free-running frequency of the oscillator when the circuit is not in service, and trim out the frequency error. This solution cannot be used, however, where the circuit is in use for long periods of time and where e.g. the temperature changes during operation, causing drift in the component characteristics and consequent drift in the free-running frequency of the oscillator.

Another solution to correcting the free-running frequency error in injection-locked oscillators is to measure the average (dc) phase error between the local oscillator clock signal and the received data signal. The dc phase error is proportional to the local oscillator free-running frequency error. The free-running frequency of the local oscillator is corrected to minimize the dc phase error. However, circuitry for measuring the dc phase error and correcting the free-running frequency is usually subject to the same changes (e.g. temperature changes) which cause the mistuning of the free-running frequency of the local oscillator in the first place.

A clock recovery system using an injection-locked local oscillator to achieve wide bandwidth, and including a simple circuit for adjusting the free-running frequency of the local oscillator which may be used during the operation of the clock recovery system, but which is not adversely affected by the same changes which affect the frequency of the local oscillator signal is desirable.

BRIEF SUMMARY OF THE INVENTION

The inventor realized that the phase of the local clock signal is only adjusted (via the injection process) by transitions in the received data signal. In between those transitions, the relative phase between the received data signal and the local oscillator signal drifts due to the difference between the frequency of the received data signal and the free-running frequency of the local clock signal. The inventor also realized that during times where transitions in the received data signal are relatively sparse, the phase error will drift in one direction—as the local oscillator frequency drifts toward the free-running frequency. Similarly, during times where transitions in the received data signal are relatively dense, the phase error will be corrected in the opposite direction—as the local oscillator frequency is drawn back toward the frequency of the input signal. Thus, the inventor realized that by correlating the direction of the phase drift with the density of the transitions of the received data signal during operation of the system, the sign and magnitude of the free-running frequency error may be estimated. From this information, the free-running frequency of the local oscillator may be corrected to minimize the phase drift.

In accordance with principles of the present invention, a clock recovery system includes a source of a data signal having transitions, an injection-locked oscillator having a free-running frequency and generating a clock signal, and a free-running frequency adjustment circuit. The free running frequency adjustment circuit includes a transition density detector for detecting the density of the transitions in the data signal; a phase error detector for detecting the phase error between the clock signal and the data signal; and a correlator for adjusting the free-running frequency of the injection locked oscillator in response to the correlation between the detected transition density in the data signal and the phase error between the data signal and the local oscillator.

A circuit according to principles of the present invention is not, to a first order, sensitive to the changes which affect the frequency of the local oscillator in the first place, and may thus be used to correct the free-running frequency of the local oscillator during the operation of the clock recovery system. In addition, circuitry according to the present invention is relatively simple and inexpensive.

DETAILED DESCRIPTION OF THE INVENTION

Figure 1:
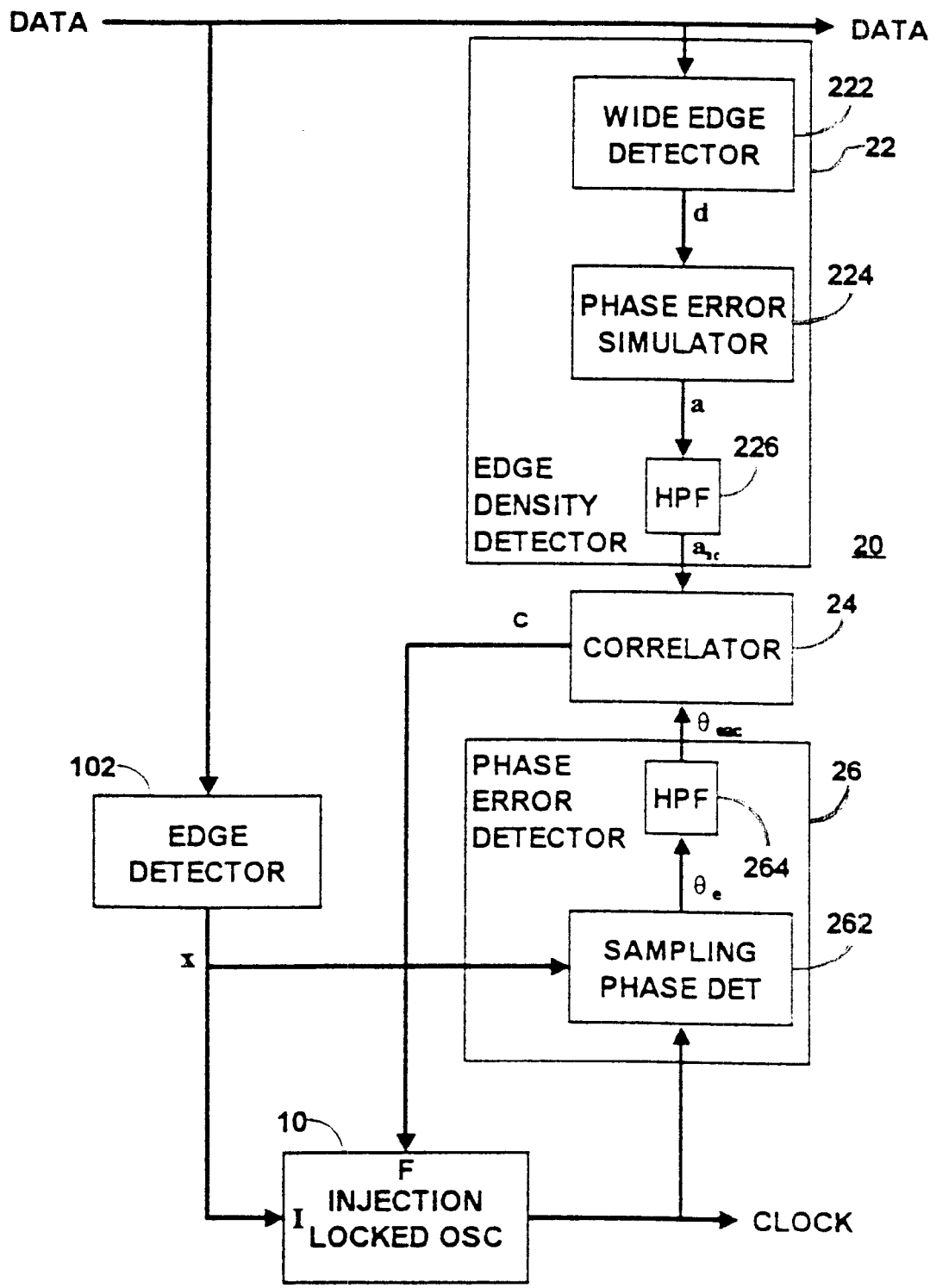
FIG. 1 is a block diagram of a clock recovery system according to the principles of the present invention.

FIG. 1 is a block diagram of a clock recovery system according to principles of the present invention. In FIG. 1, an input terminal (DATA) is coupled to a source (not shown) of a data input signal. The input terminal DATA is coupled to an output terminal DATA. The DATA output terminal is coupled to circuitry (not shown) in the remainder of the system, in which the data is processed.

The DATA input terminal is also coupled to an input terminal of a wide edge detector 222, and an input terminal of an edge detector 102. An output terminal of the wide edge detector 222 is coupled to an input terminal of a phase error simulator 224. An output terminal of the phase error simulator 224 is coupled to an input terminal of a first high pass filter (HPF) 226. An output terminal of the first HPF 226 is coupled to a first input terminal of a correlator 24. The combination of the wide edge detector 222, the phase error simulator 224 and the first HPF 226 form an edge density detector 22. An output terminal of the edge detector 102 is coupled to an injection input terminal I of an injection locked oscillator 10 and a first input terminal of a sampling phase detector 262. An output terminal of the injection locked oscillator 10 is coupled to a second input terminal of the sampling phase detector 262 and to a clock output terminal CLOCK. The CLOCK output terminal produces a clock signal locked to the data at the data input terminal and is coupled to circuitry (not shown) in the remainder of the system, requiring the clock signal for synchronization.

An output terminal of the sampling phase detector 262 is coupled to an input terminal of a second HPF 264. An output terminal of the second HPF 264 is coupled to a second input terminal of the correlator 24. The combination of the sampling phase detector 262 and the second HPF 264 forms a phase error detector 26. An output terminal of the correlator 24 is coupled to a free-running frequency adjustment terminal F of the injection locked oscillator 10.

In the illustrated embodiment, the data signal DATA carries successive data bits represented by a non-return-to-zero (NRZ) binary data signal having transition times at which the signal changes from one binary value to another. The transition times occur at a predetermined frequency, even though a transition may not occur at each transition time. Each transition of the data signal conditions the edge detector 102 to generate a pulse, which in turn conditions the injection-locked local oscillator 10 to adjust the frequency of the local clock signal CLOCK toward the frequency of the data signal. The local clock signal CLOCK from the local oscillator 10 is then supplied to the remainder of the system (not shown) and may be used to synchronize the processing of the data signal DATA, all in a known manner.

As described above, the free-running frequency of the local oscillator 10 is set during fabrication to the nominal frequency of the data signal, though it may not be exactly the frequency of the actual received data signal. The difference between the data signal frequency and the free-running frequency of the local oscillator 10 would, unless corrected, cause the relative phase between the data signal and the local clock signal to drift in a direction dependent on the relative frequencies of the local oscillator 10 and the data signal.

During periods where transitions are sparse, the local oscillator 10 has no transitions to synchronize to, and its frequency assumes the free-running frequency of the local oscillator. Therefore, during these intervals the relative phase between the local clock signal and the data signal changes linearly in a direction dependent on the relative frequencies. During periods where the transitions are dense, the local oscillator 10 is synchronized by the transitions in the data signal DATA, and its frequency moves from the free-running frequency toward the data signal frequency. During these intervals, the relative phase between the local clock signal and the data signal changes exponentially in the opposite direction.

The edge density detector 22 determines the density of the transitions in the data signal and generates a signal representing this density (as described below). Simultaneously, the phase error detector 26 determines the relative phase error between the local clock signal CLOCK and the data signal DATA and generates a signal representing this error (as described below). The correlator 24 determines the direction of change of the phase error signal during times of sparse transitions in the data signal and similarly the direction of change of the phase error signal during times of dense transitions in the data signal. From this information, the correlator 24 determines the magnitude and direction of the frequency difference between the frequency of the data signal and the free-running frequency of the local oscillator 10. The correlator 24 generates a signal which adjusts the free-running frequency of the local oscillator 10 to minimize the difference. For example, in the illustrated embodiment, the local oscillator 10 includes a controllable varactor or variable delay (not shown). The varactor or variable delay is responsive to the signal from the correlator 24 for correcting the free-running frequency of the local oscillator 10, all in a known manner.

Figure 2:
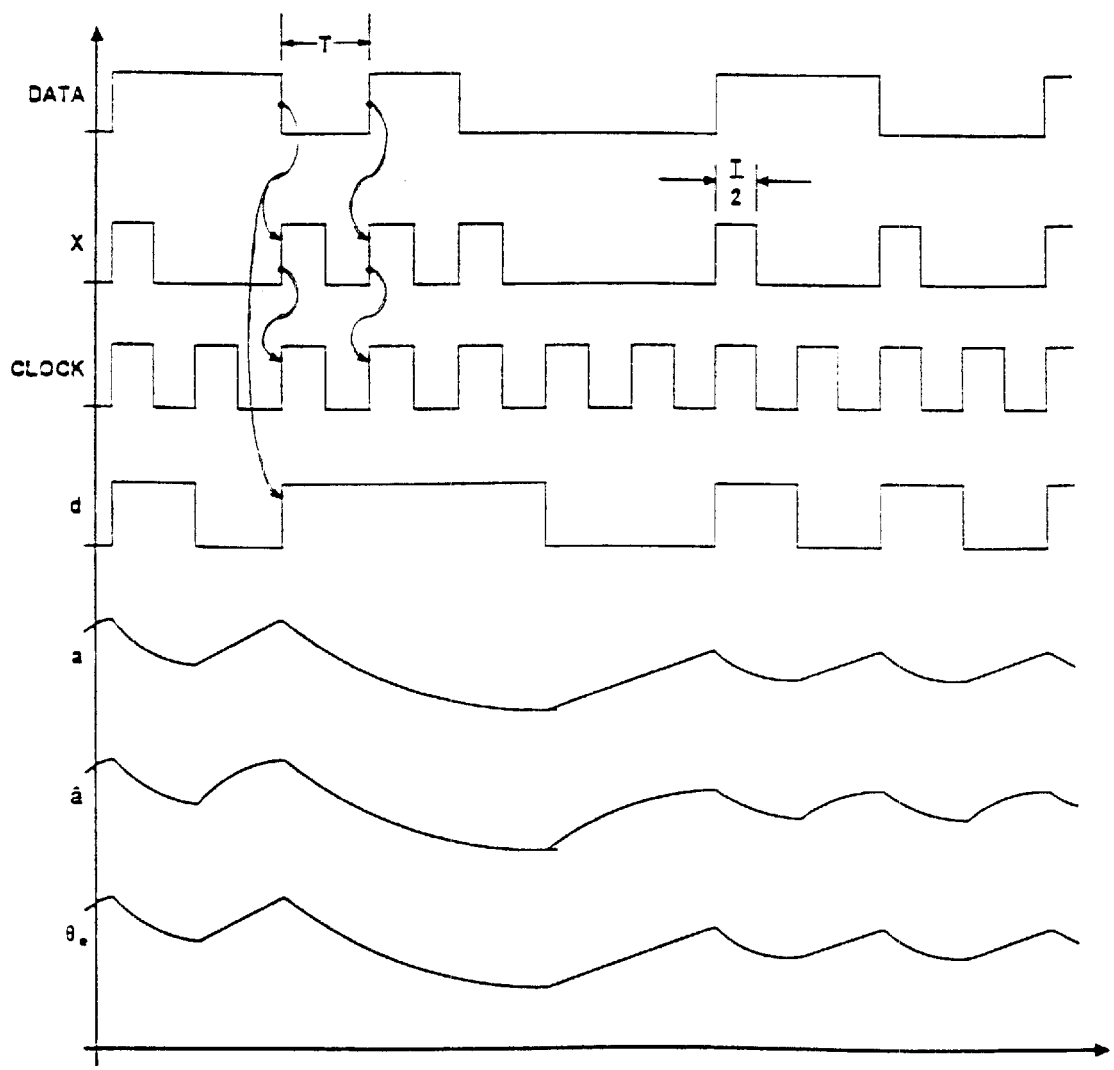
FIG. 2 is a waveform diagram illustrating waveforms useful in understanding the operation of the clock recovery system illustrated in FIG. 1.

FIG. 2 is a waveform diagram illustrating waveforms useful in understanding the operation of the clock recovery system illustrated in FIG. 1. In FIG. 2, the top waveform DATA represents an NRZ data signal. The NRZ data signal has a predetermined frequency and a corresponding period T. In the illustrated embodiment, the NRZ signal is a 10 gigahertz (GHz) signal, having data transition period T of 100 picoseconds (ps). The edge detector 102 operates in a manner to be described in more detail below to generate a signal x consisting of pulses having a width T/2 in response to transitions in the NRZ data signal. The signal x is illustrated as the second waveform in FIG. 2. The pulse signal x, in turn, conditions the injection locked oscillator 10 to produce a clock signal synchronized to the pulses in the signal x, in a known manner. The clock signal CLOCK is illustrated as the third waveform in FIG. 2.

The wide edge detector 222 operates in a manner to be described in more detail below to generate a signal d having a first state for the time period T whenever a transition occurs in the DATA signal, and a second state when no such transition occurs. The signal d is illustrated as the fourth signal in FIG. 2. In the illustrated embodiment, the signal d has a logic '1' value for a time period T after a transition in the data signal DATA and a logic '0' value otherwise. Because the duration of the logic '1' signal is equal to the time duration between transition times T, so long as transitions occur the signal d will have a logic '1' value, and will have a logic '0' value only when no transitions occur at transition times.

As described above, when no transitions occur in the data input signal, the frequency of the injection locked oscillator 10 assumes its free running frequency, and the phase of the clock signal drifts linearly in a direction depending on the relative frequencies of the clock signal CLOCK and data signal DATA. Conversely, when transitions occur in the data input signal, the frequency of the injection locked oscillator 10 is pulled to the frequency of the data input signal, and the phase moves exponentially in the other direction. The phase error simulator 224 generates a signal a which simulates the phase error which would result from a simulated injection locked oscillator having a free running frequency which differs from the frequency of the data signal DATA by a fixed amount. The signal a is illustrated as the fifth signal in FIG. 2. During periods of sparse transitions (as indicated by the signal d having a logic '0' value), the signal a moves linearly on one direction. In FIG. 2, the signal a moves linearly upward during periods of sparse transitions. During periods of dense transitions (as indicated by the signal d having a logic '1' value) the signal a moves exponentially in the other direction. In FIG. 2, the signal a moves exponentially downward during periods of dense transitions.

The sampling phase detector 262 operates in a manner to be described in more detail below to generate a signal $\theta_e$ representing the phase error between the clock signal CLOCK from the injection locked oscillator 10 and the signal x from the edge detector 102, representing the input data signal. A phase error signal generated by a standard phase detector would include a component related to the density of the transitions. This would adversely affect the accuracy of the phase error signal. To eliminate this, a sampling phase detector must be used.

The phase error signal $\theta_e$ is illustrated as the seventh signal in FIG. 2. The phase error signal $\theta_e$ drifts linearly in one direction during periods of sparse transitions, and moves exponentially in the other direction during periods of dense transitions. The magnitude of the phase error signal $\theta_e$ varies depending on the difference between the actual frequency of the data input signal DATA and the actual free-running frequency of the injection locked oscillator 10: the closer the frequencies, the smaller the magnitude variations; the larger the difference, the larger the magnitude variations. The direction of the changes in the phase error signal $\theta_e$ depends on the relative values of the actual frequency of the data signal DATA and the actual free-running frequency of the injection locked oscillator 10.

The inventor has found that uncertainties in delays and dc offsets in amplifiers can cause inaccuracies in the dc components of both the simulated phase error signal a and the phase error signal $\theta_e$. Thus, the simulated phase error signal a and the phase error signal are high pass filtered before they are correlated by HPFs 226 and 264, and producing the signals $a_{ac}$ and $\theta_{eac}$, respectively.

The correlator 24 operates in a manner to be described in more detail below to receive the simulated phase error signal $a_{ac}$ and the phase error signal $\theta_{eac}$ and compares them. The correlation between them indicates the magnitude of the difference between the frequency of the data input signal DATA and the free-running frequency of the injection locked oscillator 10 and the direction of the difference. The correlator 24 produces a signal c representing this correlation. The correlation signal is used to update the free-running frequency of the injection locked oscillator 10 toward the frequency of the data signal.

Figure 3:
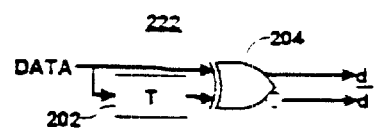
FIG. 3 is a schematic diagram of an edge detector which may be used in the clock recovery system illustrated in FIG. 1.

FIG. 3 is a schematic diagram of an edge detector 102 which may be used in the clock recovery system illustrated in FIG. 1. In FIG. 3 the data signal input terminal DATA is coupled to a first input terminal of an exclusive-OR (XOR) gate 104 and an input terminal of a delay circuit 106. The delay circuit 106 is fabricated to provide a delay of T/2 seconds. An output terminal of the delay circuit 106 is coupled to a second input terminal of the XOR gate 104. An output terminal of the XOR gate 104 generates the pulse signal x (of FIG. 2). The edge detector 102 operates in a known manner to generate a pulse signal having a duration of T/2 seconds whenever a transition occurs in the data input signal DATA. In the illustrated embodiment, the data input signal is a 10 GHz NRZ signal, and T/2 is 50 ps.

Figure 4:
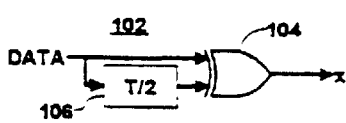
FIG. 4 is a schematic diagram of a wide edge detector which may be used in the clock recovery system illustrated in FIG. 1.

FIG. 4 is a schematic diagram of a wide edge detector 222 which may be used in the clock recovery system illustrated in FIG. 1. In FIG. 4, the data input terminal DATA is coupled to a first input terminal of an XOR gate 204 and an input terminal of a delay circuit 202. The delay circuit 202 is fabricated to provide a delay of T seconds. An output terminal of the delay circuit 202 is coupled to a second input terminal of the XOR gate 204. A non-inverting output terminal of the XOR gate 204 generates the signal d (of FIG. 2) and an inverting output terminal of the XOR gate 204 produces an inverted version of the signal d. The wide edge detector of 222 operates in a known manner to generate a pulse signal having a duration of T seconds whenever a transition occurs in the data input signal DATA. Because transitions can occur every T seconds in the data input signal DATA, the signal d remains a logic '1' signal so long as transitions occur at the transition times, and becomes a logic '0' signal only when a transition time with no transition occurs. In the illustrated embodiment, the data input signal is a 10 GHz NRZ signal, and T is 100 ps.

Figure 5:
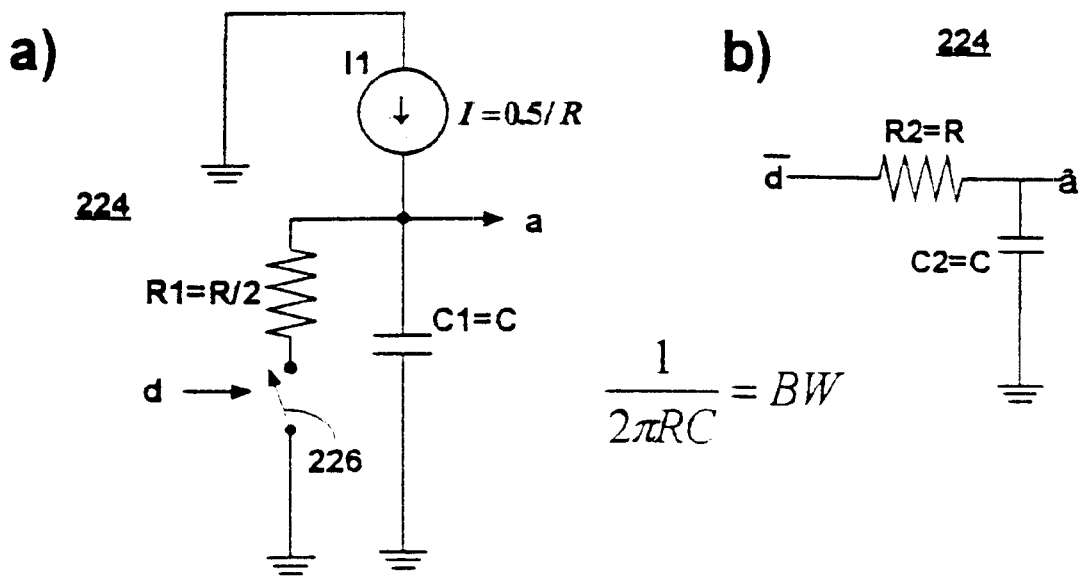
FIGS. 5a and b are schematic diagrams of phase error simulators which may be used in the clock recovery system illustrated in FIG. 1.

FIGS. 5a and b are schematic diagrams of phase error simulators 224 which may be used in the clock recovery system illustrated in FIG. 1. In FIG. 5a, a first terminal of a current source I1 is coupled to a source of reference potential (ground). A second terminal of the current source I1 is coupled to respective first electrodes of a resistor R1 and a capacitor C1 and an output terminal generating the signal a. A second electrode of the resistor R1 is coupled to a first terminal of a switch 226. A second terminal of the switch 226 is coupled to ground. A second electrode of the capacitor C1 is coupled to ground. The signal d (of FIG. 4) is coupled to a control input terminal of the switch 226.

The resistor R1 has a value equal to R/2, and the current source I1 generates a current having a constant value 0.5/R. The capacitor C1 has a value C. The values of R and C are selected according to the equation $BW=1/(2\pi RC)$, where BW equals the recovery bandwidth of the clock recovery system. In the illustrated embodiment, the data input signal is a 10 GHz signal, and the recovery bandwidth BW is selected to be 80 GHz. In operation, when the signal d is a logic '1' signal, the switch 226 is closed, and when the signal d is a logic '0', the switch 226 is open. When the switch 226 is open (d=logic '0'), the current from the current source I1 supplies a constant current I, having a value 0.5/R, to the capacitor C1. This causes the voltage across C1 to increase linearly. When the switch 226 is closed (d=logic '1'), the resistor R1 is coupled to ground. The resistor R1 sinks both the current I from the current source I1 and discharges the capacitor C1 exponentially toward ground. The resulting voltage signal a across the capacitor C1 moves linearly in one direction (i.e. increases) during times of sparse transitions in the data input signal (d=logic '0') and moves exponentially in the other direction (i.e. decreases) during times of dense transitions in the data input signal (d=logic '1'), as illustrated in FIG. 2.

The circuit illustrated in FIG. 5a is relatively complex and may be approximated with the relatively simpler circuit illustrated in FIG. 5b. In FIG. 5b, the inverted signal d, ($\bar{d}$ of FIG. 4), is coupled to a first electrode of a resistor R2. A second electrode of the resistor R2 is coupled to a first electrode of a capacitor C2 and an output terminal which generates a signal â (representing an approximation of the signal a of FIG. 5a). A second electrode of the capacitor C2 is coupled to ground. The value of the resistor R1=R and the value of the capacitor C2=C, selected according to the equation BW=1/(2πRC), as described above.

In operation, when the signal d is a logic '1' signal (dense transitions in the data input signal (DATA)) the $\bar{d}$ signal is a logic '0' signal. In this state, the capacitor discharges through the resistor R1 toward a lower voltage. Conversely, when the signal d is a logic '0' signal (sparse transitions in the data input signal (DATA)) the $\bar{d}$ signal is a logic '1' signal. In this state, the capacitor C2 charges toward a higher voltage through the resistor R1. In this manner, the â signal (i.e. the voltage level across the capacitor C2) rises during times of relatively sparse transitions in the NRZ signal and falls during times of relatively dense transitions, as for the signal a in FIG. 2. In this case, however, the signal rises and falls exponentially, rather than linearly in one direction and exponentially in the other. The â signal is the sixth signal illustrated in FIG. 2.

Figure 6:
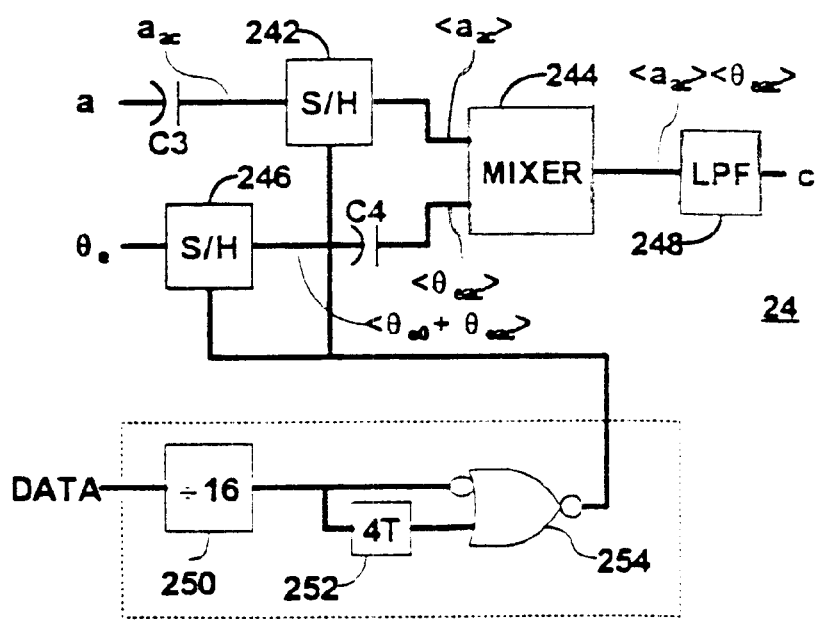
FIG. 6 is a diagram, partially in block form and partially in schematic form, of a first embodiment of a correlator which may be used in the receiver illustrated in FIG. 1.

FIG. 6 is a diagram of a correlator 24 which may be used in the clock recovery system illustrated in FIG. 1. In FIG. 6, the signal a from the phase error simulator 224 (of FIGS. 1 and 5) is coupled to a first electrode of a first capacitor C3. A second electrode of the first capacitor C3 is coupled to an input terminal of a first sample-and-hold (S/H) circuit 242. An output terminal of the first S/H circuit 242 is coupled to a first input terminal of the mixer 244. An output terminal of the mixer 244 is coupled to an input terminal of a low-pass filter (LPF) 248. An output terminal of the LPF 248 generates the signal c used to control the free-running frequency of the injection locked oscillator 10 (of FIG. 1). The $\theta_e$ signal from the phase error detector 262 is coupled to an input terminal of a second S/H circuit 246. An output terminal of the second S/H circuit 246 is coupled to a first electrode of a second capacitor C4. A second electrode of the second capacitor C4 is coupled to a second input terminal of the mixer 244.

The input data signal DATA is coupled to an input terminal of a divide-by-16 circuit 250. An output terminal of the divide-by-16 circuit 250 is coupled to an inverted input terminal of an OR gate 254 and an input terminal of a delay circuit 252. An output terminal of the delay circuit 252 is coupled to a non-inverted input terminal of the OR gate 254. An inverted output terminal of the OR gate 254 is coupled to respective control input terminals of the first and second S/H circuits 242 and 246. The combination of the divide-by-16 circuit 250, the delay circuit 252 and the OR gate 254 forms a triggering circuit for the S/H circuits 242 and 246. The divide-by-16 circuit may be implemented with a different division factor, or omitted altogether.

The S/H circuit 246 schematically represents the sampling portion of the sampling phase detector 262 (of FIG. 1) and the capacitor C4 schematically represents the HPF 264. Similarly, the capacitor C3 schematically represents the HPF 226. One skilled in the art will understand that any of the many known implementations of sampling phase detectors may be used for the sampling phase detector 262. Such phase detectors may be found in the book "Phase-Locked Loop Circuit Design" by Wolaver (Prentice Hall, 1991), section 4-1. Further, any of the many known implementations of high pass filters may be used for the high pass filters 226 and 264. The S/H 242 is included to provide a sampled signal a corresponding to the sampled phase error signal.

In operation, the combination of the divide-by-16 circuit 250, the delay circuit 252 and OR gate 254 generate trigger signals for the S/Hs 242 and 246 in a known manner. This signal triggers the S/H circuit 246 processing the phase error signal $\theta_e$, conditioning it to produce a sampled signal $<\theta_e>$. The sampled signal $<\theta_e> = <(\theta_{e0}+\theta_{eac})>$ in which $\theta_{e0}$ represents the dc component and $\theta_{eac}$ represents the ac component of the phase error signal $\theta_e$. Only the ac component passes through the capacitor C4 generating the signal $<\theta_{eac}>$. Similarly, the first capacitor C3 passes only the ac component $a_{ac}$ of the simulated phase error representative signal a. The first S/H circuit 242 generates a sampled signal $<a_{ac}>$. The sampled ac components $<a_{ac}>$ and $<\theta_{eac}>$ are mixed in the mixer 244 to form a product signal $<a_{ac}><\theta_{eac}>$ representing the correlation between the phase error signal and the simulated phase error signal. The LPF 248 generates a low pass filtered version of the product signal c, which is proportional to the frequency difference $f_0$ between the free-running frequency of the local oscillator 10 and the frequency of the NRZ input signal. This signal is supplied to the local oscillator 10 to trim its free-running frequency toward the frequency of the NRZ signal.

Because a sampling phase error detector 262 is used, any component in the phase error signal $\theta_e$ related to the edge density of the data input terminal is minimized or eliminated. Thus, the embodiment of the clock recovery system illustrated in FIGS. 1 through 6 operates properly to maintain the free-running frequency of the local oscillator 10 at the frequency of the NRZ input signal. However, for signals having relatively high frequencies, this system requires relatively fast circuitry. Such circuitry is either expensive, or may not be available at all for extremely high speeds. More specifically, the power consumption for such high speed circuitry may be too high, causing excessive heat, for integrated circuit fabrication. Thus, a second embodiment of a clock recovery system is described below which will operate at the extremely high speeds, though the circuitry will be more complicated and expensive.

Figure 7:
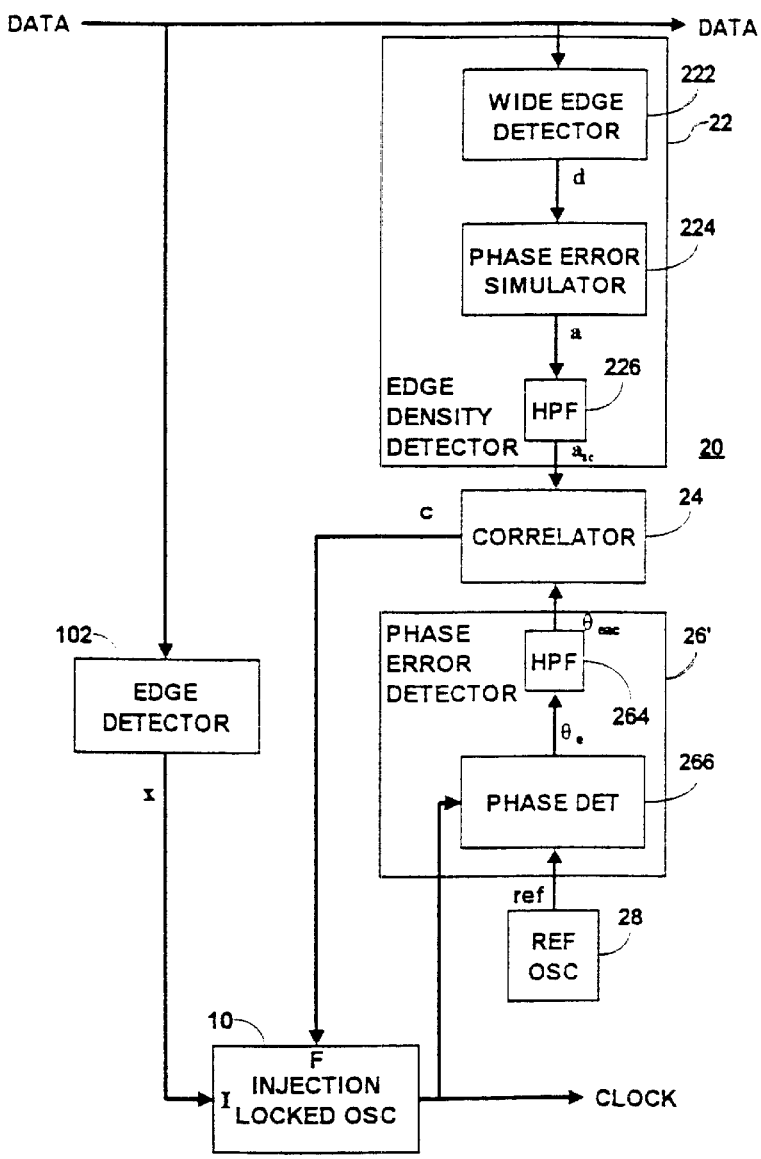
FIG. 7 is a block diagram of another embodiment of a clock recovery system according to the principles of the present invention.

FIG. 7 is a block diagram of another embodiment of a clock recovery system according to the principles of the present invention. In FIG. 7, those elements which are the same as those illustrated in FIG. 1 are designated by the same reference number and are not described in detail below. In FIG. 7, the output terminal of the injection locked oscillator 10 is coupled to a first input terminal of the phase detector 266, as in FIG. 1. However, in FIG. 7 an output terminal of a reference oscillator 28 produces a reference clock signal ref and is coupled to a second input terminal of the phase detector 266 (instead of the output terminal of the edge detector 102 as in FIG. 1).

In operation, the phase detector 266 compares the phase of the clock signal CLOCK to that of the ref signal from the reference oscillator 28 in a manner to be described in more detail below. In FIG. 7, because the phase detector 266 does not process the NRZ signal, there is no component in the phase error signal $\theta_e$ related to the density of edges in the data input signal DATA. Consequently, the phase detector 266 need not be a sampling phase detector (as in FIG. 1), and any of the many known phase error detectors may be used at the phase detector 266. Examples of acceptable phase error detectors may be found in the "Phase-Locked Loop Circuit Design" book described above.

Figure 8:
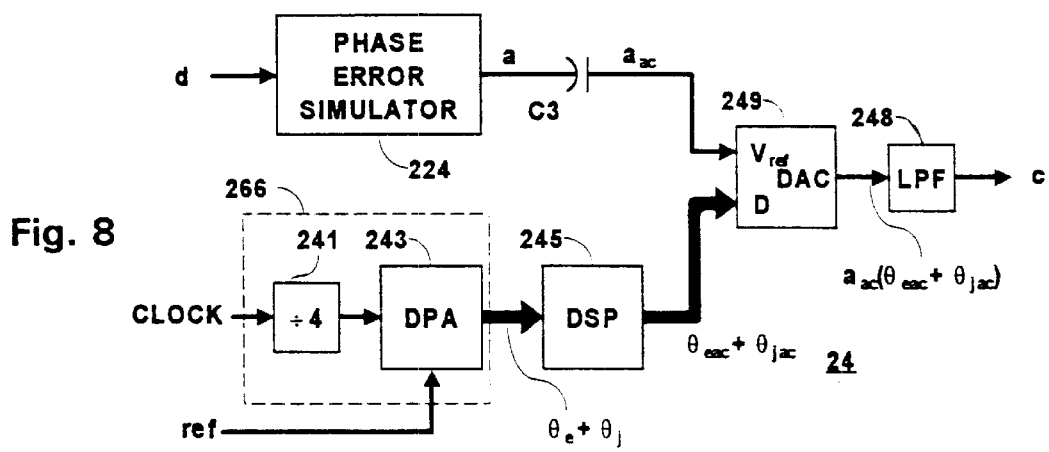
FIG. 8 is a diagram, partially in block form and partially in schematic form, of a second embodiment of a correlator which may be used in the clock recovery system illustrated in FIG.

FIG. 8 is a diagram of a correlator 24 which may be used in the clock recovery system illustrated in FIG. 7. In FIG. 8, some processing is performed digitally. Wide lines represent multibit digital signal lines, and thin lines represent analog signal lines. The transition representative signal d is coupled to an input terminal of the phase error simulator 224 (of FIG. 5) which generates the simulated phase error signal a. The simulated phase error signal a from the phase error simulator 224 is coupled to a first electrode of a capacitor C3, as illustrated in FIG. 6. A second electrode of the capacitor C3 generates the $a_{ac}$ signal and is coupled to a reference input terminal $V_{ref}$ of a multiplying digital-to-analog converter (DAC) 249.

The CLOCK signal from the injection locked oscillator 10 (of FIG. 7) is coupled to an input terminal of a divide-by-4 circuit 241. An output terminal of the divide-by-4 circuit 241 is coupled to a data input terminal of a digital phase analyzer (DPA) 243. The reference clock signal ref from the reference oscillator 28 (of FIG. 7) is coupled to a reference input terminal of the DPA 243. The combination of the divide-by-four circuit 241 and the DPA 243 form the phase detector 266. A multibit digital output terminal of the DPA 243 carries the phase error signal $\theta_e$. The phase error signal $\theta_e$ is coupled to an input terminal of a digital signal processor DSP 245. The DSP 245 operates as the HPF 264. An output terminal of the DSP 245 generates a signal including only the ac component $\theta_{eac}$ of the phase error signal $\theta_e$ and is coupled to a data input terminal D of the DAC 249. An output terminal of the DAC 249 is coupled to an input terminal of a second LPF 248. An output terminal of the second LPF 248 generates a signal c, which is coupled to the control input terminal of the local oscillator 10 (of FIG. 7).

In operation, the CLOCK signal is the recovered clock signal from the injection-locked local oscillator 10 (of FIG. 7). The CLOCK signal, thus, has been phase corrected at least to some extent by the received data input signal DATA and includes a phase component related to the phase of the data input signal. The reference clock oscillator 28 generates a clock signal ref having a very stable frequency. In the illustrated embodiment, the stable frequency is one-fourth the nominal frequency of the input data signal DATA. The divide-by-four circuit 241 divides the CLOCK signal from the injection-locked oscillator 10 by four to match the frequency of the reference oscillator 28. The DPA 243 compares the phase of the frequency-divided recovered clock signal CLOCK to this stable frequency reference signal Ref and generates a stream of multibit digital samples representing the phase difference between them. A DPA 243 which operates in the manner described above is described in U.S. patent application Ser. No. 09/322,951, filed May 28, 1999 by Wolaver et al.

The phase representative samples from the DPA 243 include a first component $\theta_e$ representing the phase drift resulting from the frequency difference between the free-running frequency of the injection locked oscillator 10 and the frequency of the data input signal DATA, and a second component $\theta_j$ representing the phase jitter and drift of the data input signal itself However, in the present case, the data input signal has a relatively small bandwidth compared to the bandwidth of the clock recovery system. For example, in the illustrated embodiment, the data input signal may have a bandwidth of less than 8 MHz, while the bandwidth of the clock recovery system is 80 MHz. Thus, the contribution to the DPA 243 output samples from the second component $\theta_j$, representing phase jitter/drift of the NRZ signal, is limited to the lower 8 MHz of the 80 MHz bandwidth, while the contribution from the first component $\theta_e$ representing the phase drift due to the frequency difference between the data input signal DATA and the free-running frequency of the injection locked oscillator 10, is across the entire bandwidth of the clock recovery system. The assumption, thus, is that the contribution due to the phase jitter/drift of the data input signal DATA in the output samples from the DPA will be too small to be significant, and the composite signal may be used to correct the free-running frequency of the local oscillator 10 without being adversely affected by the presence of significant portions of the data input signal DATA phase jitter and drift information.

The DSP 245 performs a digital high-pass filtering function on the phase representative samples to generate a stream of samples representing the ac component $\theta_{eac}+\theta_{jac}$ of the phase error between the free-running frequency of the local oscillator 10 and the data input signal. In addition, because the free-running frequency of the local oscillator 10 drifts very slowly, primarily in response to temperature changes, the output sample from the DSP 245 may be updated at a relatively low rate, for example, only once each second.

The ac component of the phase error simulation signal $a_{ac}$ is generated in the manner described above with reference to FIG. 6. This signal supplies the reference voltage to the multiplying DAC 249. The multiplying DAC 249 converts the digital samples from the DSP 245 to an analog signal which is the product of the value represented by the phase error representative samples $\theta_{eac}+\theta_{jac}$ times the analog signal $a_{ac}$ at the $V_{ref}$ input terminal representing the edge density of the data input signal DATA, in a known manner. The LPF 248 narrows the passband of the signal $a_{ac}(\theta_{eac}+\theta_{jac})$ from the DAC 249 to, in the illustrated embodiment, 10 kHz to generate the c signal. The c signal corrects the free-running frequency of the injection locked oscillator 10 (of FIG. 7).

What is claimed is:

1. In a clock recovery system including a source of a data signal having transitions, and an injection-locked oscillator having a free-running frequency and generating a clock signal, a free-running frequency adjustment circuit, comprising:

a transition density detector, coupled to the data signal source, for detecting the density of the transitions in the data signal;

a phase error detector, for detecting the phase error between the clock signal and the data signal; and a correlator, coupled to the transition density detector and the phase error detector, for adjusting the free-running frequency of the local oscillator in response to the correlation between the detected transition density in the data signal and the phase error between the data signal and the injection locked oscillator.

2. The clock recovery system of claim 1 wherein the phase error detector is a sampling phase error detector, responsive to the data signal and the clock signal for generating a signal representing the phase difference between the clock signal and the data signal.

3. The clock recovery system of claim 2 wherein the phase error detector comprises:

a phase detector coupled to the injection locked oscillator and the data signal source;

a sample-and-hold circuit coupled between the phase detector and the correlator and having a control input terminal; and a trigger circuit, coupled between the data signal source and the control input terminal of the sample-and-hold circuit.

4. The clock recovery system of claim 3 further comprising a second sample-and-hold circuit coupled between the transition density detector and the correlator and having a control input terminal coupled to the trigger circuit.

5. The clock recovery system of claim 2 wherein the correlator comprises a mixer having a first input terminal coupled to the transition density detector, a second input terminal coupled to the phase error detector, and an output terminal, coupled to a control input terminal of the injection locked oscillator, for adjusting the free running frequency of the injection locked oscillator.

6. The clock recovery system of claim 5 further comprising a low pass filter coupled between the mixer and the injection locked oscillator.

7. The clock recovery system of claim 1 further comprising a reference oscillator, generating a reference signal, wherein the phase error detector is responsive to the reference signal and the clock signal for generating a signal representing the phase difference between the clock signal and the reference signal.

8. The clock recovery system of claim 7 wherein the phase error detector comprises a phase detector coupled to the injection locked oscillator and the reference oscillator.

9. The clock recovery system of claim 7 wherein the correlator comprises:
   a digital phase analyzer, coupled to the injection locked oscillator and the reference oscillator for generating a series of multibit digital samples representing the phase difference between the clock signal and the reference signal;
   a digital signal processor, responsive to the digital samples from the digital phase analyzer, for producing a series of multibit digital samples representing the high pass filtered phase difference between the clock signal and the reference signal; and
   a multiplying digital-to-analog converter, having a digital input terminal coupled to the digital signal processor, an analog reference input terminal coupled to the transition density detector, and an output terminal coupled to a control input terminal of the injection locked oscillator.

10. The clock recovery system of claim 9 further comprising a low pass filter coupled between the transition density detector and the analog reference terminal of the digital-to-analog converter.

11. The clock recovery system of claim 9 further comprising a low pass filter coupled between the output terminal of the digital-to-analog converter and the injection locked oscillator.

12. The clock recovery system of claim 1 further comprising:
   a first high pass filter coupled between the transition density detector and the correlator; and
   a second high pass filter coupled between the phase error detector and the correlator.

13. The clock recovery system of claim 1 wherein the transition density detector comprises:
   a transition detector, responsive to the data signal, for generating a transition representative signal when transitions are detected in the data signal; and
   a transition density signal generator, coupled to the transition detector, for generating a signal having a first characteristic when a transition representative signal is generated and a second characteristic otherwise.

14. The clock recovery system of claim 13 wherein the data signal is a non-return-to-zero (NRZ) signal which has transition times which recur at a fixed time interval, and the transition detector comprises:
   a delay circuit, coupled to the data signal source, for delaying an input signal by the fixed time interval; and
   an exclusive-OR gate, having a first input terminal coupled to the data signal source, a second input terminal coupled to the delay circuit, and an output terminal generating the transition representative signal.

15. The clock recovery system of claim 13 wherein the transition density signal generator comprises circuitry for generating a signal having a value which moves in a first direction when a transition representative signal is generated and which moves in the other direction otherwise.

16. The clock recovery system of claim 13 wherein the transition density signal generator comprises circuitry for generating a signal representing a simulated phase error signal which would result from the data signal and an oscillator having a predetermined free running frequency.

17. The clock recovery system of claim 16 wherein the transition density signal generator generates the simulated phase error signal having a signal value which moves in a first direction when a transition representative signal is generated and which moves in the other direction otherwise.

18. The clock recovery system of claim 17 wherein the transition density signal generator generates the simulated phase error signal having a signal value which moves exponentially in a first direction when a transition representative signal is generated and which moves linearly in the other direction otherwise.

19. The clock recovery system of claim 18 wherein the transition density signal generator comprises:
   a current source;
   a capacitor, having a first electrode coupled to the current source and generating the simulated phase error signal and a second electrode coupled to a source of a reference potential (ground);
   a resistor, having a first electrode coupled to the current source and a second electrode; and
   a controllable switch, having a control input terminal coupled to the transition detector, a first terminal coupled to the second electrode of the resistor, a second terminal coupled to ground;
   wherein voltage across the capacitor increases linearly when the controllable switch is open, and decreases exponentially when the switch is closed.

20. The clock recovery system of claim 17 wherein the transition density signal generator generates the simulated phase error signal having a signal value which moves exponentially in a first direction when a transition representative signal is generated and which moves exponentially in the other direction otherwise.

21. The clock recovery system of claim 20 wherein the transition density signal generator comprises:
   a resistor having a first electrode coupled to the transition detector and a second electrode generating the simulated phase error representative signal; and
   a capacitor having a first electrode coupled to the second electrode of the resistor and a second electrode coupled to a source of a reference potential (ground).

* * * * *